(12) United States Patent
Burghoorn (10) Patent No.: US 6,876,436 B2
(45) Date of Patent: Apr. 5, 2005

(54) INTERFEROMETRIC ALIGNMENT SYSTEM FOR USE IN VACUUM-BASED LITHOGRAPHIC APPARATUS

(75) Inventor: Jacobus Burghoorn, Haelen (NL)

(73) Assignee: ASML Netherlands, B.V., Veldhoven (NL)

( * ) Notice: Subject to any disclaimer, the term of this patent is extended or adjusted under 35 U.S.C. 154(b) by 31 days.

(21) Appl. No.: 10/294,817

(22) Filed: Nov. 15, 2002

(65) Prior Publication Data

US 2003/0095241 A1 May 22, 2003

Related U.S. Application Data

(63) Continuation of application No. 09/741,009, filed on Dec. 21, 2000, now Pat. No. 6,507,388.

(30) Foreign Application Priority Data

Dec. 23, 1999 (EP) .............................................. 99310519

(51) Int. Cl.⁷ ......................... G03B 27/52; G03B 27/42; G03B 27/54; G01B 11/00
(52) U.S. Cl. ............................. 355/67; 355/53; 355/30; 356/399
(58) Field of Search ............................. 355/53, 55, 30; 356/399–401

(56) References Cited

U.S. PATENT DOCUMENTS

| 4,011,403 | A | | 3/1977 | Epstein et al. |
|---|---|---|---|---|
| 4,326,805 | A | | 4/1982 | Feldman et al. |
| 4,629,313 | A | * | 12/1986 | Tanimoto ...................... 355/53 |
| 4,749,278 | A | * | 6/1988 | van der Werf .............. 356/401 |
| 4,778,275 | A | | 10/1988 | Van Den Brink et al. |
| 5,877,505 | A | | 3/1999 | Fujino |
| 5,963,616 | A | | 10/1999 | Silfvast et al. |
| 6,018,413 | A | | 1/2000 | Oka |
| 6,160,622 | A | | 12/2000 | Dirksen et al. |
| 6,268,904 | B1 | | 7/2001 | Mori et al. |
| 6,281,966 | B1 | * | 8/2001 | Kenmoku ..................... 355/55 |
| 6,304,319 | B1 | * | 10/2001 | Mizutani ...................... 355/69 |
| 6,411,368 | B1 | * | 6/2002 | Matsumoto et al. .......... 355/67 |

* cited by examiner

Primary Examiner—Russell Adams
Assistant Examiner—D. Ben Esplin
(74) Attorney, Agent, or Firm—Pillsbury Winthrop LLP (57) ABSTRACT

In a lithographic apparatus having a movable object table in vacuum, an interferometer-based alignment system for detecting the position of that object table has a passive part in vacuum and an active part outside the vacuum chamber. The active part contains the beam generator, e.g. a laser, and the electronic detectors whilst the passive part contains the illumination and imaging optics. The two parts are coupled by optical fibers. The interferometer may make use of different diffraction orders from measurement and reference gratings and the order separation may be included in the passive part.

53 Claims, 3 Drawing Sheets

INTERFEROMETRIC ALIGNMENT SYSTEM FOR USE IN VACUUM-BASED LITHOGRAPHIC APPARATUS

This application is a continuation of U.S. application Ser. No. 09/741,009, filed Dec. 21, 2000, now U.S. Pat. No. 6,507,388 which claims priority from European Application No. 99310519.6, filed Dec. 23, 1999, the entire contents of which are incorporated herein by reference.

BACKGROUND OF THE INVENTION

1. Field of the Invention

The present invention relates to interferometer-based alignment and position measurement systems. More particularly, the invention relates to such systems used in lithographic projection apparatus comprising:

- an illumination system for supplying a projection beam of radiation;
- patterning means, for patterning the projection beam according to a desired pattern;
- a substrate table for holding a substrate; and
- a projection system for imaging the patterned beam onto a target portion of the substrate.

2. Design of the Related Art

The term "patterning means" should be broadly interpreted as referring to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device (see below). Examples of such patterning means include:

- A mask table for holding a mask. The concept of a mask is well known in lithography, and its includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. The mask table ensures that the mask can be held at a desired position in the incoming radiation beam, and that it can be moved relative to the beam if so desired.
- A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference.
- A programmable LCD array. An example of such a construction is given in U.S. Pat. No. 5,229,872, which is incorporated herein by reference. For purposes of simplicity, the rest of this text may, at certain locations, specifically direct itself to examples involving a mask table and mask; however, the general principles discussed in such instances should be seen in the broader context of the patterning means as hereabove set forth.

Also for the sake of simplicity, the projection system may hereinafter be referred to as the "lens"; however, this term should be broadly interpreted as encompassing various types of projection system, including refractive optics, reflective optics, and catadioptric systems, for example. The illumination system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and U.S. Ser. No. 09/180,011, filed Feb. 27, 1998 (WO 98/40791), incorporated herein by reference.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

There is a continuing desire in the semiconductor industry to be able to manufacture integrated circuits (ICs) with ever higher component densities and hence smaller feature size. To image smaller features in a lithographic projection apparatus it is necessary to use projection radiation of shorter wavelength. A number of different type of projection radiation have been proposed, including Extreme Ultraviolet (EUV) in the 10–20 nm range, electron beams, ion beams and other charged particle fluxes. These types of radiation beam share the requirement that the beam path, including the mask, substrate and optical components, be kept in a high vacuum. This is to prevent absorption and/or scattering of the beam and a total pressure of less than about $10^{-6}$ millibar is necessary. Optical elements for EUV radiation can be spoiled by the deposition of carbon layers on their surface which imposes the additional requirement that hydrocarbon partial pressures must be kept below $10^{-8}$ or $10^{-9}$ millibar.

Working in such a high vacuum imposes quite onerous conditions on the components that must be put into the vacuum and on the vacuum chamber seals, especially those around any part of the apparatus where a motion must be fed-through to components inside the chamber from the exterior. For components inside the chamber, materials that minimize or eliminate contaminant outgassing, either from the materials themselves or from gases adsorbed on their surfaces, must be used.

It also is well known that the substrate (wafer) that is being exposed must be positioned to extremely high accuracy relative to the mask (reticle). A wafer may undergo 20 or 30 exposures during the manufacture and it is essential that the various images are properly aligned, even if different lithography apparatus are used for different exposures. The overlay accuracy requirements only increase with reduced feature size and shorter wavelength radiation.

SUMMARY OF THE INVENTION

An object of the present invention is to provide an alignment and/or position measuring system capable of measuring the position of an object in vacuum with high accuracy, e.g. for use in a lithographic projection apparatus.

According to the present invention there is provided a lithographic projection apparatus comprising:

an illumination system for supplying a projection beam of radiation;

patterning means, for patterning the projection beam according to a desired pattern;

a substrate table for holding a substrate; and a projection system for imaging the patterned beam onto a target portion of the substrate; characterized by:

a vacuum chamber in which at least one of said patterning means and said substrate table is contained, said object table being movable; and an alignment system constructed and arranged to align said patterning means and a substrate on said substrate table, said alignment system comprising a passive part contained in said vacuum chamber and an active part outside said vacuum chamber.

By positioning only the passive part of the alignment system inside the vacuum chamber, the present invention avoids difficulties in making the active part of the alignment system vacuum compatible and reduces heat and vibration generation in the vacuum system, which may disturb the exposure and cause positioning uncertainties.

In embodiments of the present invention, the active and passive parts of the system are coupled together by optical fibers. The alignment system may be an interferometer system for detecting the position of a measurement grating (wafer mark) relative to a reference grating. Such a system may image at least two orders of radiation diffracted by the measurement grating onto the reference grating and may comprise beam splitting means to separate radiation diffracted by the reference grating and deriving from one order diffracted by the measurement grating from diffracted radiation deriving from other orders diffracted by the measurement grating.

According to a further aspect of the invention there is provided a device manufacturing method comprising the steps of:

providing a substrate that is at least partially covered by a layer of radiation-sensitive material;

providing a projection beam of radiation using an illumination system;

using patterning means to endow the projection beam with a pattern in its cross-section;

projecting the patterned beam of radiation onto a target portion of the layer of radiation-sensitive material; and providing a vacuum chamber which comprises a movable substrate table for holding the substrate; characterized by the step of:

prior to or during said step of irradiating and imaging, aligning said patterning means and substrate on said substrate table using an alignment system comprising a passive part provided in said vacuum chamber and an active part provided outside said vacuum chamber.

In a manufacturing process using a lithographic projection apparatus according to the invention a pattern in a mask is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

In the present document, the terms "radiation" and "beam" are used to encompass all types of electromagnetic radiation or particle flux, including, but not limited to, ultraviolet (UV radiation (e.g. at a wavelength of 365 nm, 248 nm, 193 nm, 157 nm or 126 nm), extreme ultraviolet (EUV) radiation, X-rays, electrons and ions.

BRIEF DESCRIPTION OF THE DRAWINGS

The present invention will be described below with reference to exemplary embodiments and the accompanying schematic drawings, in which.

In the drawings, like references indicate like parts.

DETAILED DESCRIPTION OF THE EMBODIMENTS

Embodiment 1

Figure 1:
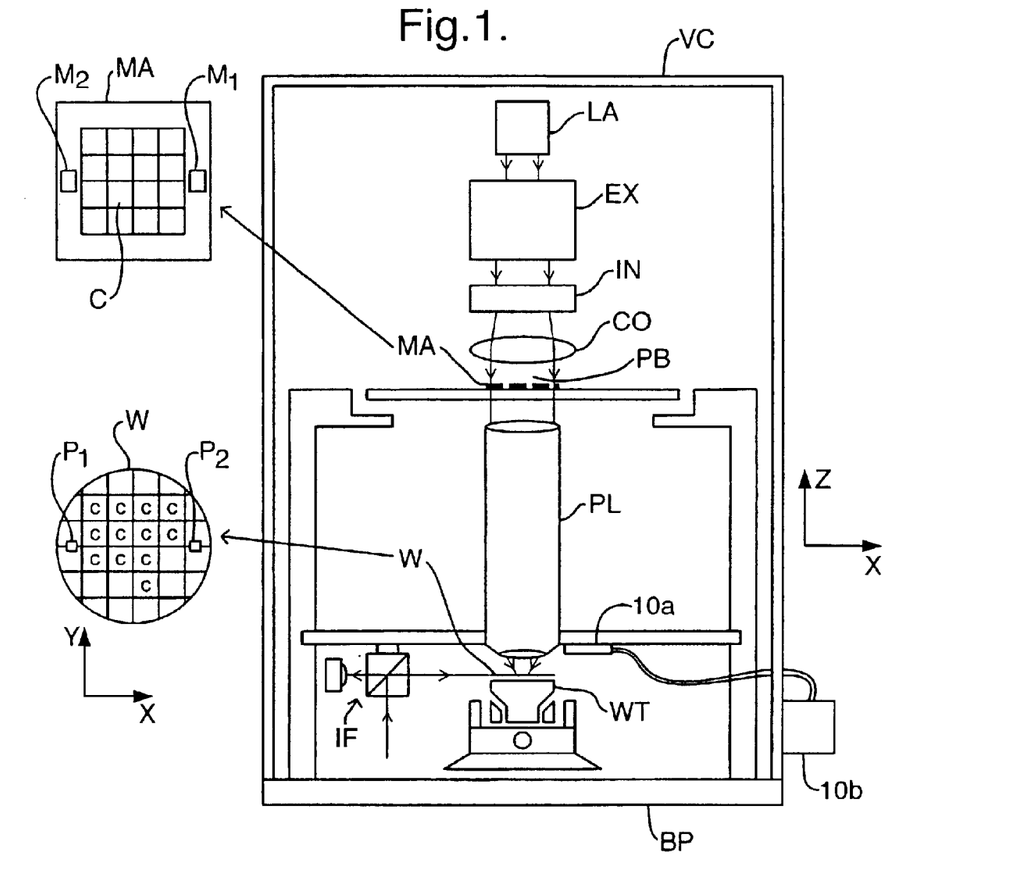
FIG. 1 depicts a lithographic projection apparatus according to a first embodiment of the invention.

FIG. 1 schematically depicts a lithographic projection apparatus according to the invention. The apparatus comprises:

a radiation system LA, EX IN, CO for supplying a projection beam PB of radiation (e.g. UV or EUV radiation);

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive or catadioptric system, a mirror group or an array of field deflectors) for imaging an irradiated portion of the mask MA onto a target portion C of the substrate W.

As here depicted, the apparatus is of a transmissive type (i.e. has a transmissive mask). However, in general, it may also be of a reflective type, for example.

The radiation system comprises a source LA (e.g. a Hg lamp, excimer laser, an undulator provided around the path of an electron beam in a storage ring or synchrotron, a plasma source, or an electron or ion beam source) which produces a beam of radiation. This beam is passed along various optical components comprised in the illumination system,—e.g. beam shaping optics EX, an integrator IN and a condenser CO—so that the resultant beam PB has a desired shape and intensity distribution in its cross-section.

The beam PB subsequently intercepts the mask MA which is held in a mask holder on a mask table MT. Having passed through the mask MA, the beam PB passes through the lens PL, which focuses the beam PB onto a target portion C of the substrate W. With the aid of the interferometric displacement measuring means IF and the second positioning means, the substrate table WT can be moved accurately, e.g. so as to position different target portions C in the path of the beam PB. Similarly, the interferometric displacement means IF and the first positioning means can be used to accurately position the mask MA with respect to the path of the beam PB, e.g. after mechanical retrieval of the mask MA from a mask library. In general, movement of the object tables MT, WT will be realized with the aid of a long stroke module (course positioning) and a short stroke module (fine positioning), which are not explicitly depicted in FIG. 1.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is moved in the same or opposite direction at a speed V=Mv, in which M is the magnification of the lens PL (typically, M=¼ or ⅕). In this manner, a relatively large target portion C can be exposed, without having to compromise on resolution.

Figure 2:
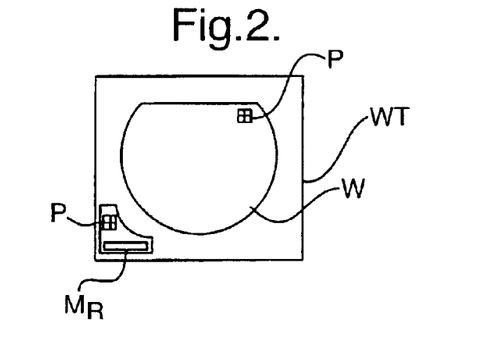
FIG. 2 is a plan view of the substrate table of the first embodiment of the invention.

During projection of the mask image onto the target portion C, the mask MA and the substrate W have to be aligned correctly. A correct alignment may be achieved by aligning one or more markers $M_1$, $M_2$ provided on the mask MA with respect to one or more corresponding reference markers $M_R$ provided on wafer table WT, as shown in FIG. 2. The position of the substrate table with respect to the mask will then be known. Such an alignment may be achieved by using projection (actinic) radiation and the projection system to image the markers $M_1$, $M_2$ onto the reference marker $M_R$. The reference marker may take the form of an image sensor provided on the substrate (wafer) table WT. Details of such an image sensor are not shown in the figures. More information on an image sensor can be gleaned from European Patent Application 00202960.1 incorporated herein by reference (applicant's ref.: P-0203). The mask table and/or the wafer table may be moved to obtain an aligned position, which will be recorded with the aid of the interferometric displacement measuring system IF. However, other schemes for aligning mask MA and substrate table WT may also be employed.

Further, the position of the wafer W with respect to the wafer table WT must be known in order to align the wafer W with respect to the mask MA. An additional alignment system 10, which embodies the present invention, is used for this purpose. With the alignment system 10, one or more markers $P_1$, $P_2$, P, in the form of diffraction gratings provided on the wafer and wafer table will be aligned with respect to a reference marker or grating 13 of the alignment system 10 by moving the wafer table WT. Recording the respective aligned positions with the aid of the interferometric displacement measuring means IF will then yield a position of the wafer with respect to the wafer table. The markers P and $M_R$ on the wafer table WT are shown in FIG. 2 on a common plate, which is mounted on the wafer table. An arrangement of this type, in which part or all of the alignment process can be carried out away from the main axis of the machine (the optical axis of the projection system PL), is sometimes referred to as an "off-axis" alignment system.

The wafer W and the wafer table WT are contained in a vacuum chamber VC that is maintained at a vacuum during operation of the apparatus. The alignment system 10 comprises a passive part 10a enclosed in the vacuum chamber and an active part 10b disposed outside the vacuum chamber VC.

Figure 3:
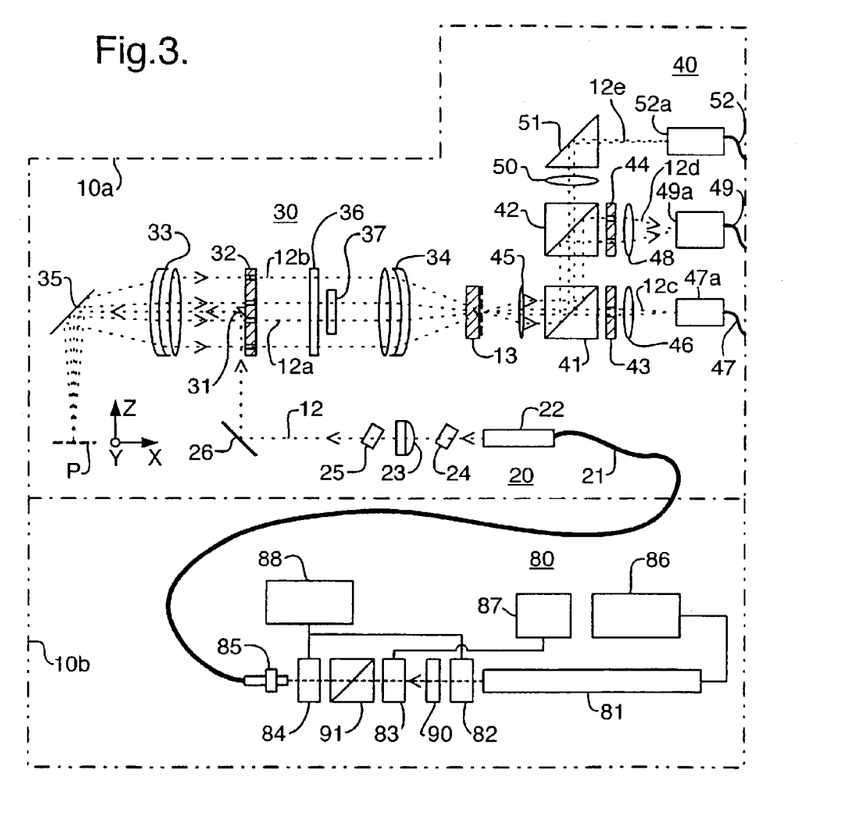
FIG. 3 is a diagram of the optical components of an alignment system in the first embodiment of the invention.

The optical components of the alignment system 10 are shown in FIG. 3. The passive part 10a enclosed in the vacuum chamber VC of alignment system 10 comprises three main sections; illumination branch 20, imaging branch 30 and detection branch 40. These branches respectively perform the functions of: collimating and adjusting the measurement beam 12; projecting the measurement beam 12 onto the wafer marker P and imaging the diffracted radiation onto the fixed reference grating 13; and separating the resultant diffraction beams so that they can be converted into electronic signals for use by the control system of the lithography apparatus. The active part 10b provided outside the vacuum chamber VC in this embodiment consists of the laser module 80 shown in FIG. 3 and photodetectors (not shown) for converting the sub-beams separated by the detection branch into electronic control signals.

The laser module 80 includes laser 81 which is, for example, a 10 mW HeNe laser outputting a beam of wavelength 633 nm. The beam is first passed through a safety shutter 82, Faraday isolator 90, modulator 83, polarizing beam splitter 91 and attenuator 84, which is provided for control purposes. The safety shutter 82 completely blocks the laser beam when it is not required, and particularly when the apparatus has been opened up, e.g. for maintenance, for safety reasons. Faraday isolator 90 prevents unwanted back reflections from any of the optical components in the system reaching the laser 81 and disturbing its operation, e.g. by causing frequency pulling or mode hopping, etc. Piezoelectric modulator 83 and polarizing beam splitter 91 are used in a modulation-demodulation detection scheme to enhance the signal to noise ratio of the sensor. The beam is coupled into a single-mode polarization-preserving fiber 21, which is optimized for the wavelength of the radiation, via fiber manipulator 85 and is taken into the vacuum chamber. The laser module 80 can also conveniently include the laser power supply 86, modulator driver 87 and control electronics 88 in the same package.

In the illumination branch 20, situated in the vacuum chamber VC, the measurement beam 12 exits the fiber terminator 22 that includes collimating optics to provide a collimated beam. The collimated beam is focused at the center of the pupil plane of the imaging branch 30 by a plano-convex lens 23. A first plane-plate 24 before plano-convex lens 23 is used to adjust the angle of the measurement beam at the imaging branch pupil and hence the position of the beam at the plane of the wafer. An initial, coarse, adjustment of this can be done by X-Y translation of the fiber optics output. A second plane-plate 25 is positioned after the plano-convex lens 23 and used to adjust the position of the measurement beam 12 at the pupil plane and hence its angle of incidence at the plane of the wafer. Finally, a 90° mirror 26 brings the measurement beam into the imaging branch 30.

Having entered the imaging branch, the measurement beam is coupled along the optical axis (Z-axis) using a small mirror 31. Mirror 31 is conveniently mounted in the center of first order-diaphragm 32, whose purpose is described below.

The imaging branch is a 4-f double telecentric optical system with magnification M=−1. It contains optics in the form of first and second air-spaced doublets 33, 34 each having a focal length of about 50 mm and being made of SF1. The use of air-spaced doublets is preferred since optical cements, such as would be found in a simpler achromatic doublet, may not be vacuum compatible. The accuracy of the spacing of the singlets in the doublet is a major determinant of system performance and is assured by using accurately machined ceramic spacer balls (the error in the radius being <1 $\mu$m); this guarantees high mounting accuracy (i.e. spacing distance), vacuum compatibility and thermal stability. SF1 is a heave flint glass having a refractive index of about 1.7 which allows the lenses to have a suitable focal length without an excessive radius of curvature. The symmetry of the system reduces any aberrations caused by uncertainty in the refractive index of the SF1 glass. To this end the lenses should all be made from the same batch of glass.

First order-diaphragm 32, bearing mirror 31 is mounted between first and second doublets 33, 34 so that the measurement beam is collimated on wafer marker P on wafer W by first doublet 33. Front mirror 35 is provided so that the alignment system can be positioned in a convenient location and the measurement beam 12 is incident normally on the reference mark P. Front mirror 35 may be a Zerodur (TM) substrate (for thermal stability) with metallic coating for efficient reflection of the S-polarized illumination beam at 45° angle of incidence as well as the returning diffraction orders at angles of < about 54°. The mirror may be mounted on a Zerodur (TM) frame for additional thermal stability.

At the wafer marker P, the illumination beam is reflected and diffracted into diffraction orders at specific angles in the XZ and YZ planes. The first doublet 33 has an aperture sized to select the diffraction orders up to and including the fourth and focuses the collimated orders in its back focal plane. The parallel orders pass through first order-diaphragm 32 that includes apertures which pass only the first 12a and fourth 12b diffraction orders. A linear polarizer 36 is used to clean-up the polarization of both orders 12a, 12b, since this may have become slightly elliptical on reflection by front mirror 35, after which only the first order 12a is passed through a half-wave plate 37 so that the linear polarization states of the two orders are 90° apart. Polarizer 36 may be formed of borosilicate glass with aligned silver particles, which is a vacuum compatible component, and effectively reduces cross-talk between the two beams. Half-wave plate 37 may be a quartz plate of appropriate thickness for the single wavelength of the measurement beam 12.

Second lens doublet 34 images the first and fourth orders 12a, 12b onto its back focal plane in which the fixed reference grating 13 is positioned. The reference pattern of reference grating 13 is a hard copy formed of chromium on glass of the aerial image of the plus and minus sub-beams of the first-order beams from the wafer marker P. During X-Y movement of the wafer and wafer table WT, and hence wafer marker P, for example during an alignment scan, the total image of the wafer marker at the reference pattern will move correspondingly. The transmitted light is then captured and measured by the detection branch 40.

At the reference grating 13, the light in the first-order beam 12a will be diffracted into diffraction orders forming beams which are spatially well-separated from the beams formed of the diffraction orders into which the light in the fourth-order beam 12b is diffracted. Diffraction orders of the plus and minus sub-beams of the first-order beam 12a will overlap as will diffraction orders of the plus and minus sub-beams of the fourth order beam 12b. As well as being spatially well-separated, the diffraction components deriving from the first-order beam 12a and those deriving from the fourth-order beam 12b will have linear polarization states differing by 90°, since the linear polarization states of the first-order beam 12a and the fourth-beam 12b are 90° apart. In the detection branch 40, diffraction components deriving from the first-order beam 12a and those deriving from the fourth-order beam 12b are separated into first and second signal sub-beams 12c, 12d respectively by first and second polarizing beam splitters 41, 42 and further order-diaphragms 43, 44.

To achieve this separation, the beams diffracted by the reference pattern 13 are first collimated by a second lens 45 and then are incident on first polarizing beam splitter 41 which substantially passes the components deriving from the first-order beam 12a and substantially deflects those deriving from the fourth-order beam 12b. Selected components deriving from the first-order beam 12a pass through second order-diaphragm 43 (components deriving from the fourth-order beam 12b being blocked) and are then imaged by third lens 46 on a set of four optical fibers or fiber bundles, comprising first detection fiber set 47, mounted in fiber terminator 47a. The positioning of these fibers, or fiber bundles, corresponds to the four quadrants of the reference mark P, described below.

The components deriving from fourth-order beam 12b are substantially deflected by first polarizing beam splitter 41 to second polarizing beam splitter 42 which diverts them through third order-diaphragm 44 which only passes selected components deriving from the fourth-order beam 12b. A third lens 48 images the selected components onto a second detection fiber set 49 mounted in fiber terminator 49a.

Such components as pass through the second beam splitter 42 are projected by fourth lens 50 and a 90° bending prism 51 onto a coherent fiber bundle 52 mounted in terminator 52a. The resulting image beam, third signal sub-beam 12e, carries an image of the reference pattern 13.

The first, second and third signal sub-beams 12c, 12d, 12e are taken out of the vacuum chamber by their respective fiber bundles 47, 49, 52. The first and second signal sub-beams are passed to detectors of known type to make an accurate measurement of the reference mark position in a known alignment scan process. The third signal sub-beam is taken to a CCD camera to provide a visual indication of the alignment to an operator of the apparatus.

Figure 4:
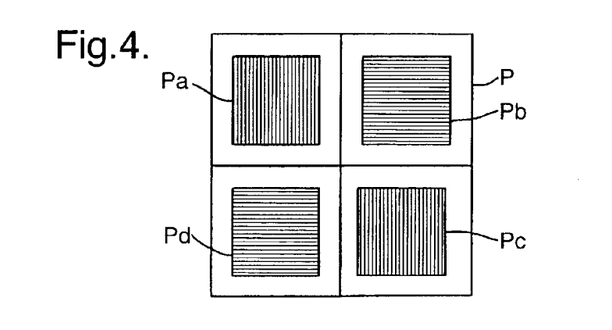
FIG. 4 is an enlarged view of the reference mark used in the first embodiment of the invention.

FIG. 4 is an aerial view of the wafer marker P showing its four quadrants Pa, Pb, Pc, Pd. These are arranged such that two diagonally opposite quadrants Pa, Pc have grating lines parallel to the X-axis whilst the other two quadrants Pb, Pd have grating lines parallel to the Y-axis.

EMBODIMENT 2

Figure 5:
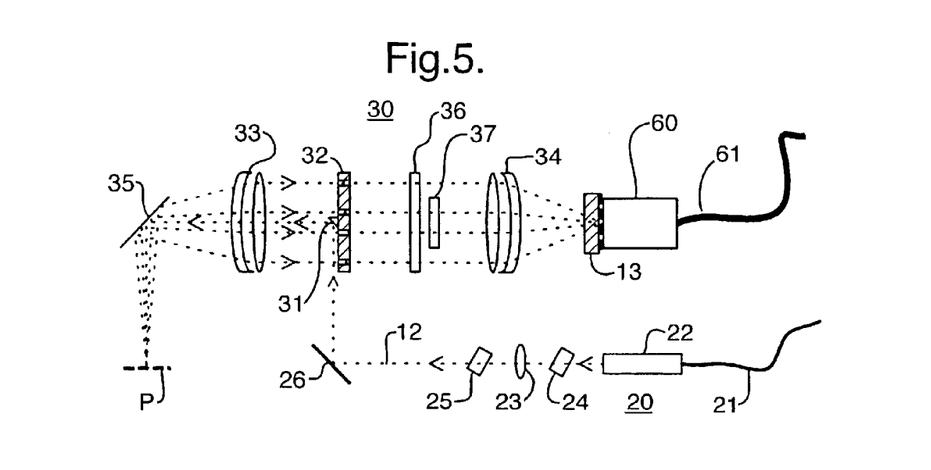
FIG. 5 is diagram of the optical components in vacuum in an alignment system according to a second embodiment of the invention.
Figure 6:
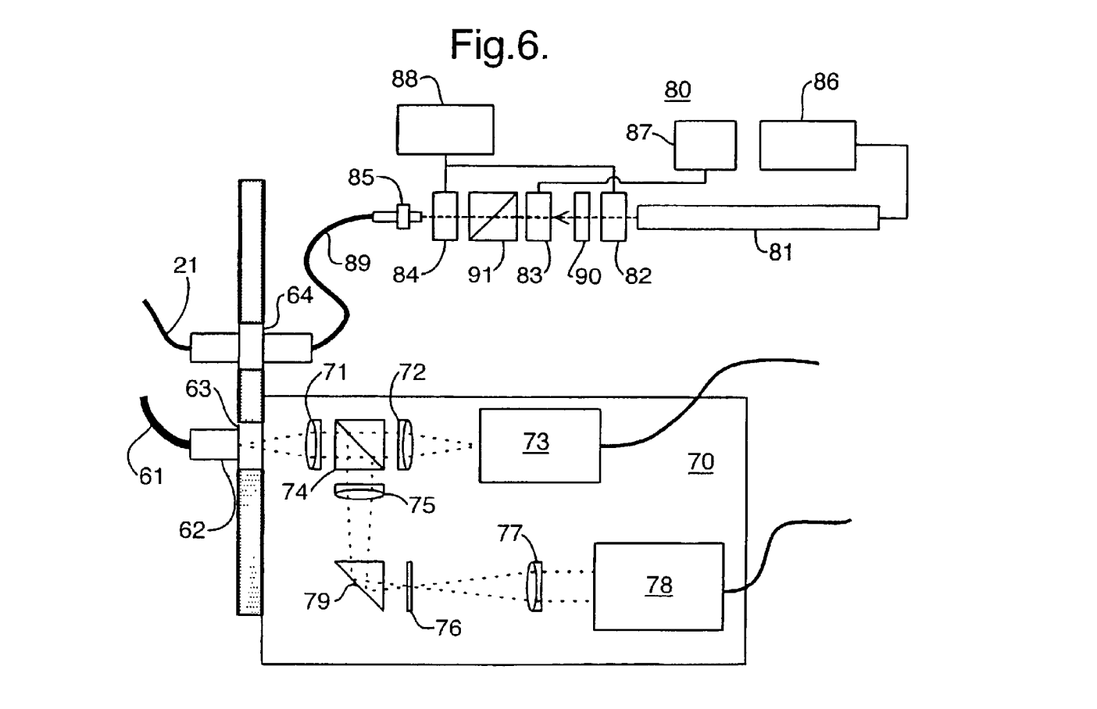
FIG. 6 is a diagram of the optical components outside vacuum in the second embodiment of the invention.

A second embodiment of the invention is illustrated in FIGS. 5 and 6. This embodiment shares a number of components with the first embodiment and parts not specifically described below are similar to the corresponding parts of the first embodiment. For example, the laser module 80, illumination branch 20 and imaging branch 30 in the second embodiment are essentially the same as those of the first embodiment. The major difference between the two embodiments is that the detection branch 70 is located outside the vacuum chamber VC.

As shown in FIG. 5, in the second embodiment, the light passing through the reference grating 13, which represents a combined image of gratings P and 13, is collected by a fiber taper 60 which magnifies the image and delivers it into fiber bundle 61 to be taken out of the vacuum chamber to detection branch 70, shown in FIG. 6. In the fiber taper the fiber ends are tapered and packed closer together so that the image grows as it is transmitted down the bundle.

Fiber bundle 61 terminates at a terminator 62 and emits the combined image signal through window 63 in the wall of the vacuum chamber VC. On the other side of the vacuum wall, the combined image is projected by lenses 71, 72 onto a photodiode detector 73 of known type, including a preamp, which provides the electronic alignment signal for the apparatus control systems. The photodiode detector 73 has four quadrants to separately detect the four gratings of the wafer and reference gratings P, 13. To provide a visual indication of alignment to the operator, a portion of the combined image signal is diverted by a polarizing beam splitter 74 positioned between lenses 71, 72. This beam is focused by lens 75 onto a cross-hair reference 76 at the focus of lens 77 that then focuses the beam onto CCD camera 78. For convenience in arranging the components of detection branch 70, a corner prism 79 is included after lens 75 to bring the camera branch parallel to the signal branch.

FIG. 6 also shows how the light from laser module 80 is taken via fiber 89 to window 64 in vacuum chamber wall thorough which it is transmitted to fiber 21 leading to the illumination branch in the vacuum chamber.

In a variation of the second embodiment, the first-order and fourth-order beams can be separated and separately detected outside the vacuum chamber VC for improved alignment accuracy, provided that fiber 61 is polarization preserving.

Whilst we have described above a specific embodiment of the invention it will be appreciated that the invention may be practiced otherwise than described. The description is not intended to limit the invention. In particular it will be appreciated that the invention may be used with either or both the substrate or mask table of a lithographic apparatus.

What is claimed is:

1. A lithographic projection apparatus comprising:
   a projection beam patterning device constructed and arranged to pattern a projection beam according to a desired pattern;
   a substrate table constructed and arranged to hold a substrate;
   a projection system constructed and arranged to image the patterned beam onto a target portion of the substrate;
   a vacuum chamber in which at least one of said projection beam patterning device and the substrate is contained; and
   an alignment system constructed and arranged to align said projection beam patterning device and a substrate on said substrate table, said alignment system comprising a passive part contained in said vacuum chamber and an active part outside said vacuum chamber,
   wherein said active part comprises a system constructed and arranged to generate a beam of radiation.

2. Apparatus according to claim 1 wherein said passive part comprises essentially only passive optical components and support structures.

3. Apparatus according to claim 2 wherein said passive optical components comprise essentially only components selected from the group comprising: reflecting, diffracting, refracting, directing, selecting, polarizing and filtering components.

4. Apparatus according to claim 1 wherein said passive part contains essentially no light generating components.

5. Apparatus according to claim 1 wherein said passive part contains essentially no electronic current carrying components.

6. Apparatus according to claim 1 wherein said alignment system comprises an off-axis alignment system constructed and arranged to align the substrate on the substrate table with respect to a reference.

7. Apparatus according to claim 1 wherein said active part comprises a camera.

8. Apparatus according to claim 1 wherein:
   said active part comprises a measurement beam generator constructed and arranged to generate a measurement beam of radiation; and
   said passive part comprises optical components constructed and arranged to direct said measurement beam onto a mark, to receive radiation reflected thereby and to direct it into a signal beam.

9. Apparatus according to claim 8 wherein said active part comprises a detector.

10. Apparatus according to claim 9 wherein said alignment system comprises a first optical fiber constructed and arranged to couple said measurement beam from said active part to said passive part and a second optical fiber constructed and arranged to couple said signal beam from said passive part to said active part.

11. Apparatus according to claim 8 wherein said alignment system is an optical interferometer system, and said passive part comprises:
    an order diaphragm constructed and arranged to select at least two different orders of radiation diffracted by said mark in the form of a measurement grating, said selected orders comprising plus and minus diffracted sub-beams;
    a reference grating; and
    an optical system constructed and arranged to direct the selected orders onto said reference grating, wherein radiation diffracted by said reference grating forms said signal beam.

12. Apparatus according to claim 11 wherein said alignment system comprises an optical fiber constructed and arranged to couple an image of said reference grating to said active part, and said active part comprises a photodetector constructed and arranged to detect said signal beam from said optical fiber.

13. Apparatus according to claim 11 wherein said alignment system further comprises a beam splitter constructed and arranged to separate said signal beam into multiple sub-beams, each separated signal sub-beam comprising radiation diffracted by said reference grating and deriving from one order diffracted by said measurement grating.

14. Apparatus according to claim 13 wherein said beam splitter forms part of said passive part; and said alignment system further comprises a first optical fiber constructed and arranged to couple said measurement beam from said active part to said passive part and a second optical fiber comprising separate optical fibers or fiber bundles, each constructed and arranged to couple one of said separated signal sub-beams from said passive part to said active part.

15. Apparatus according to claim 13 wherein said beam splitter further comprises at least one diaphragm arranged behind said beam splitter and constructed to selectively pass radiation diffracted by said reference grating and deriving from one order diffracted by said measurement grating.

16. Apparatus according to claim 13 wherein said alignment system comprises a polarization director constructed and arranged to have two selected orders in linear polarization states that are 90° apart; and said beam splitter comprises at least one polarizing beam splitter constructed and arranged to selectively pass or deflect radiation diffracted by said reference grating and deriving from one order diffracted by said measurement grating.

17. Apparatus according to claim 16 wherein said polarization director comprises a linear polarizer and a half-wave plate.

18. Apparatus according to claim 11 wherein said reference grating is substantially a hard copy of an aerial image of the plus and minus sub-beams of the lowest order diffracted by said measurement grating and selected by said order diaphragm.

19. Apparatus according to claim 11 wherein said order diaphragm is constructed and arranged to select an even and an odd order diffracted by said measurement grating.

20. Apparatus according to claim 19 wherein said order diaphragm is constructed and arranged to select first and fourth orders diffracted by said measurement grating.

21. A device manufacturing method comprising:
    providing a projection beam of radiation;
    patterning the projection beam using a patterning device;
    projecting the patterned beam of radiation onto a target portion of a layer of radiation-sensitive material on a substrate in a vacuum chamber; and
    aligning said patterning device and substrate prior to or during said projecting, using an alignment system comprising a passive part provided in said vacuum chamber and an active part provided outside said vacuum chamber, wherein a measurement beam of radiation used in aligning is generated in said active part.

22. The method according to claim 21 wherein said passive part comprises essentially only passive optical components and support structures.

23. The method according to claim 21 wherein said passive part contains essentially no light generating components.

24. The method according to claim 21 wherein said passive part contains essentially no electronic current carrying components.

25. The method according to claim 21 comprising, in said passive part, directing said measurement beam onto a mark, receiving radiation reflected thereby and directing it into a signal beam.

26. The method according to claim 25 wherein said active part comprises a detector.

27. The method according to claim 26 wherein said alignment system comprises a first optical fiber constructed and arranged to couple said measurement beam from said active part to said passive part and a second optical fiber constructed and arranged to couple said signal beam from said passive part to said active part.

28. A lithographic projection apparatus comprising:
    a projection beam patterning device constructed and arranged to pattern a projection beam according to a desired pattern;
    a substrate table constructed and arranged to hold a substrate;
    a projection system constructed and arranged to image the patterned beam onto a target portion of the substrate;
    a vacuum chamber in which at least one of said projection beam patterning device and the substrate is contained; and
    an alignment system constructed and arranged to align said projection beam patterning device and a substrate on said substrate table, said alignment system comprising a passive part contained in said vacuum chamber and an active part outside said vacuum chamber,
    wherein said active part comprises a detector constructed and arranged to receive a beam of radiation.

29. Apparatus according to claim 28 wherein said passive part comprises essentially only passive optical components and support structures.

30. Apparatus according to claim 29 wherein said passive optical components comprise essentially only components selected from the group comprising: reflecting, diffracting, refracting, directing, selecting, polarizing and filtering components.

31. Apparatus according to claim 28 wherein said passive part contains essentially no light generating components.

32. Apparatus according to claim 28 wherein said passive part contains essentially no electronic current carrying components.

33. Apparatus according to claim 28 wherein said alignment system comprises an off-axis alignment system constructed and arranged to align the substrate on the substrate table with respect to a reference.

34. Apparatus according to claim 28 wherein said active part comprises a camera.

35. Apparatus according to claim 28 wherein:
said active part comprises a measurement beam generator constructed and arranged to generate a measurement beam of radiation; and
said passive part comprises optical components constructed and arranged to direct said measurement beam onto a mark, to receive radiation reflected thereby and to direct it into a signal beam.

36. Apparatus according to claim 35 wherein said alignment system comprises a first optical fiber constructed and arranged to couple said measurement beam from said active part to said passive part and a second optical fiber constructed and arranged to couple said signal beam from said passive part to said active part.

37. Apparatus according to claim 35 wherein said alignment system is an optical interferometer system, and said passive part comprises:
an order diaphragm constructed and arranged to select at least two different orders of radiation diffracted by said mark in the form of a measurement grating, said selected orders comprising plus and minus diffracted sub-beams;
a reference grating; and
an optical system constructed and arranged to direct the selected orders onto said reference grating, wherein radiation diffracted by said reference grating forms said signal beam.

38. Apparatus according to claim 37 wherein said alignment system comprises an optical fiber constructed and arranged to couple an image of said reference grating to said active part, and said active part comprises a photodetector constructed and arranged to detect said signal beam from said optical fiber.

39. Apparatus according to claim 37 wherein said alignment system further comprises a beam splitter constructed and arranged to separate said signal beam into multiple sub-beams, each separated signal sub-beam comprising radiation diffracted by said reference grating and deriving from one order diffracted by said measurement grating.

40. Apparatus according to claim 39 said beam splitter forms part of said passive part; and said alignment system further comprises a first optical fiber constructed and arranged to couple said measurement beam from said active part to said passive part and a second optical fiber comprising separate optical fibers or fiber bundles, each constructed and arranged to couple one of said separated signal sub-beams from said passive part to said active part.

41. Apparatus according to claim 39 wherein said beam splitter further comprises at least one diaphragm arranged behind said beam splitter and constructed to selectively pass radiation diffracted by said reference grating and deriving from one order diffracted by said measurement grating.

42. Apparatus according to claim 39 wherein said alignment system comprises a polarization director constructed and arranged to have two selected orders in linear polarization states that are 90° apart; and said beam splitter comprises at least one polarizing beam splitter constructed and arranged to selectively pass or deflect radiation diffracted by said reference grating and deriving from one order diffracted by said measurement grating.

43. Apparatus according to claim 42 wherein said polarization director comprises a linear polarizer and a half-wave plate.

44. Apparatus according to claim 37 wherein said reference grating is substantially a hard copy of an aerial image of the plus and minus sub-beams of the lowest order diffracted by said measurement grating and selected by said order diaphragm.

45. Apparatus according to claim 37 wherein said order diaphragm is constructed and arranged to select an even and an odd order diffracted by said measurement grating.

46. Apparatus according to claim 45 wherein said order diaphragm is constructed and arranged to select first and fourth orders diffracted by said measurement grating.

47. A device manufacturing method comprising:
providing a projection beam of radiation;
patterning the projection beam using a patterning device;
projecting the patterned beam of radiation onto a target portion of a layer of radiation-sensitive material on a substrate in a vacuum chamber; and
aligning said patterning device and substrate prior to or during said projecting, using an alignment system comprising a passive part provided in said vacuum chamber and an active part provided outside said vacuum chamber, wherein said active part comprises a detector.

48. The method according to claim 47 wherein said passive part comprises essentially only passive optical components and support structures.

49. The method according to claim 47 wherein said passive part contains essentially no light generating components.

50. The method according to claim 47 wherein said passive part contains essentially no electronic current carrying components.

51. The method according to claim 47 comprising, in said passive part, directing said measurement beam onto a mark, receiving radiation reflected thereby and directing it into a signal beam.

52. The method according to claim 47 wherein a measurement beam of radiation used in aligning is generated in said active part.

53. The method according to claim 52 wherein said alignment system comprises a first optical fiber constructed and arranged to couple said measurement beam from said active part to said passive part and a second optical fiber constructed and arranged to couple a signal beam from said passive part to said active part.

* * * * *

UNITED STATES PATENT AND TRADEMARK OFFICE
CERTIFICATE OF CORRECTION

PATENT NO. : 6,876,436 B2
DATED : April 5, 2005
INVENTOR(S) : Burghoorn

It is certified that error appears in the above-identified patent and that said Letters Patent is hereby corrected as shown below:

Title page,
Item [56], References Cited, U.S. PATENT DOCUMENTS, add:
-- 4,716,441  12/1987  OGAWA.
5,917,604  06/1999  DIRKSEN et al.
6,020,964  02/2000  LOOPSTRA et al.
6,188,150  02/2001  SPENCE
6,327,025  12/2001  IMAI
2003/0117600  06/2003  TANIUCHI et al --
FOREIGN PATENT DOCUMENTS, add:
-- WO 98/39689 09/1998  WIPO --

Signed and Sealed this

Second Day of August, 2005

JON W. DUDAS
*Director of the United States Patent and Trademark Office*